(12) United States Patent
Pyo et al.

(10) Patent No.: US 10,762,958 B2
(45) Date of Patent: Sep. 1, 2020

(54) RESISTIVE MEMORY DEVICE INCLUDING A REFERENCE CELL AND METHOD OF CONTROLLING A REFERENCE CELL TO IDENTIFY VALUES STORED IN MEMORY CELLS

(71) Applicant: Samsung Electronics Co., Ltd., Suwon-si, Gyeonggi-do (KR)

(72) Inventors: Suk-soo Pyo, Hwaseong-si (KR); Hyun-taek Jung, Seoul (KR); So-hee Hwang, Yongin-si (KR); Tae-joong Song, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/127,995

(22) Filed: Sep. 11, 2018

(65) Prior Publication Data
US 2019/0088322 A1 Mar. 21, 2019

(30) Foreign Application Priority Data

Sep. 15, 2017 (KR) .................. 10-2017-0118843
Feb. 20, 2018 (KR) .................. 10-2018-0020006

(51) Int. Cl.
*G11C 11/16* (2006.01)
*G11C 13/00* (2006.01)
*G11C 11/56* (2006.01)

(52) U.S. Cl.
CPC ........ *G11C 13/004* (2013.01); *G11C 11/1655* (2013.01); *G11C 11/1657* (2013.01); *G11C 11/1673* (2013.01); *G11C 11/5607* (2013.01); *G11C 11/1659* (2013.01); *G11C 2013/0054* (2013.01)

(58) Field of Classification Search
CPC . G11C 13/00; G11C 11/1655; G11C 11/1657; G11C 11/1673; G11C 11/5607; G11C 11/1659
See application file for complete search history.

(56) References Cited

U.S. PATENT DOCUMENTS

| | | | |
|---|---|---|---|
| 8,255,758 B2 | 8/2012 | Anholt et al. | |
| 8,301,972 B2 | 10/2012 | Tang | |
| 8,509,003 B2 | 8/2013 | Lin et al. | |
| 8,576,617 B2 | 11/2013 | Zhu et al. | |
| 8,644,060 B2 | 2/2014 | Abedifard et al. | |
| 8,693,273 B2 | 4/2014 | Yuh et al. | |
| 9,620,191 B2 | 4/2017 | Pyo | |
| 10,431,300 B2 * | 10/2019 | Pyo | G11C 13/0033 |
| 2006/0227598 A1 * | 10/2006 | Sakimura | G11C 11/15 365/158 |
| 2008/0246537 A1 | 10/2008 | Aziz | |
| 2012/0147664 A1 * | 6/2012 | Rho | G11C 11/1697 365/158 |

(Continued)

*Primary Examiner* — Mushfique Siddique
(74) *Attorney, Agent, or Firm* — Myers Bigel, P.A.

(57) ABSTRACT

A method of controlling a reference cell in a resistive memory to identify values stored in a plurality of memory cells is provided. The method includes writing a first value to the plurality of memory cells, providing, to the reference cell, monotonically increasing or monotonically decreasing reference currents. The method includes reading the plurality of memory cells as each of the reference currents is provided to the reference cell, and determining a read reference current based on an aggregation of results of the reading.

17 Claims, 13 Drawing Sheets

(56) References Cited

U.S. PATENT DOCUMENTS

| | | | |
|---|---|---|---|
| 2012/0314478 A1* | 12/2012 | Ha | G11C 8/10 365/148 |
| 2013/0051122 A1* | 2/2013 | Mori | G11C 13/004 365/148 |
| 2013/0250670 A1* | 9/2013 | Nakai | G11C 11/161 365/158 |
| 2014/0112055 A1* | 4/2014 | Kawahara | G11C 13/00 365/148 |
| 2016/0078915 A1* | 3/2016 | Katayama | G11C 7/065 365/158 |
| 2016/0125926 A1* | 5/2016 | Kim | G11C 11/1673 365/158 |
| 2016/0379708 A1* | 12/2016 | Katayama | G11C 11/1675 365/148 |
| 2019/0088299 A1* | 3/2019 | Antonyan | G11C 13/004 |
| 2019/0088328 A1* | 3/2019 | Antonyan | G11C 7/08 |
| 2019/0385656 A1* | 12/2019 | Lee | G11C 11/1657 |

* cited by examiner

RESISTIVE MEMORY DEVICE INCLUDING A REFERENCE CELL AND METHOD OF CONTROLLING A REFERENCE CELL TO IDENTIFY VALUES STORED IN MEMORY CELLS

CROSS-REFERENCE TO RELATED APPLICATIONS

This U.S. non-provisional patent application claims priority under 35 U.S.C. § 119 to Korean Patent Application No. 10-2017-0118843, filed on Sep. 15, 2017, and Korean Patent Application No. 10-2018-0020006, filed on Feb. 20, 2018, in the Korean Intellectual Property Office, the disclosures of which are incorporated herein in their entirety by reference.

BACKGROUND

The inventive concept relates to a resistive memory device, and more particularly, to a resistive memory device including a reference cell and a method of controlling the reference cell.

Resistive memory devices may store data in memory cells including variable resistance elements. To detect the data stored in the memory cells of the resistive memory devices, for example, a read current may be provided to the memory cells. A voltage, generated due to the read current and the variable resistance elements of the memory cells, may be detected.

In the memory cells storing certain values, resistances of the variable resistance elements may have distributions that may vary according to a process voltage temperature (PVT) and the like. To accurately read the values stored in the memory cells, it may be important to accurately and promptly set a threshold resistance that may be used to distinguish distributions of resistances that respectively correspond to different values.

SUMMARY

The inventive concept provides a resistive memory device, and more particularly, a resistive memory device that is capable of accurately reading values stored in memory cells by controlling a reference cell and a method of controlling the reference cell.

According to an aspect of the inventive concept, there is provided a method of controlling a reference cell included in a resistive memory to identify values stored in a plurality of memory cells. The method includes writing a first value to the plurality of memory cells, providing, to the reference cell, reference currents that monotonically increase or monotonically decrease, reading the plurality of memory cells as each of the reference currents is provided to the reference cell, and determining a read reference current based on results of the reading.

According to another aspect of the inventive concept, there is provided a method of controlling a reference cell in a resistive memory to identify values stored in a plurality of memory cells. The method includes writing a first value to the plurality of memory cells, setting monotonically increasing or monotonically decreasing resistances of a reference resistor connected to the reference cell and through which a reference current passes, reading the plurality of memory cells under each of resistances of the reference resistor; and determining a read reference resistance based on results of the reading.

According to another aspect of the inventive concept, there is provided a resistive memory device that is configured to receive a reference adjustment signal. The resistive memory device includes a cell array including a memory cell and a reference cell. The memory cells are connected to respective first source lines and respective first bit lines, and the reference cell is connected to a second source line and a second bit line The resistive memory device includes a current source circuit configured to provide a read current and a variable reference current respectively to the memory cells and the reference cell via the first source lines or the second source line. The resistive memory device includes an amplification circuit configured to detect voltages between the first source lines connected to the memory cells and second source line connected to the reference cell, and a control circuit configured to control the current source circuit such that the reference current may be adjusted regardless of the read current, in response to the reference adjustment signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Figure 1:
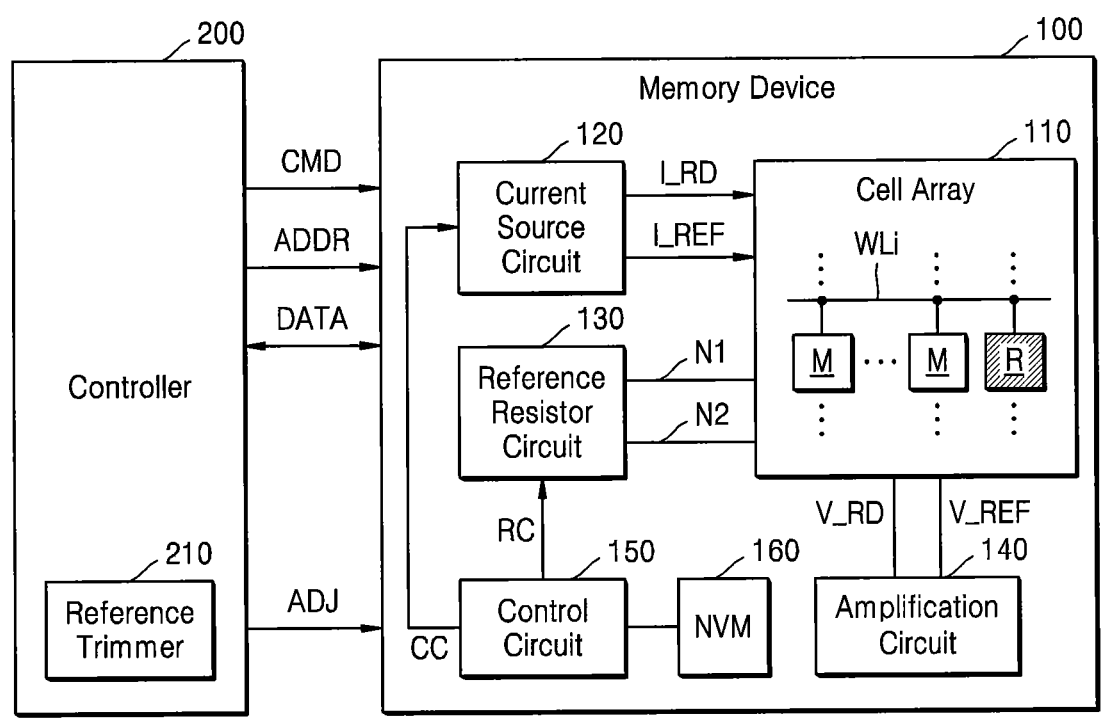
FIG. 1 is a block diagram illustrating a memory device and a controller, according to example embodiments.
Figure 2:
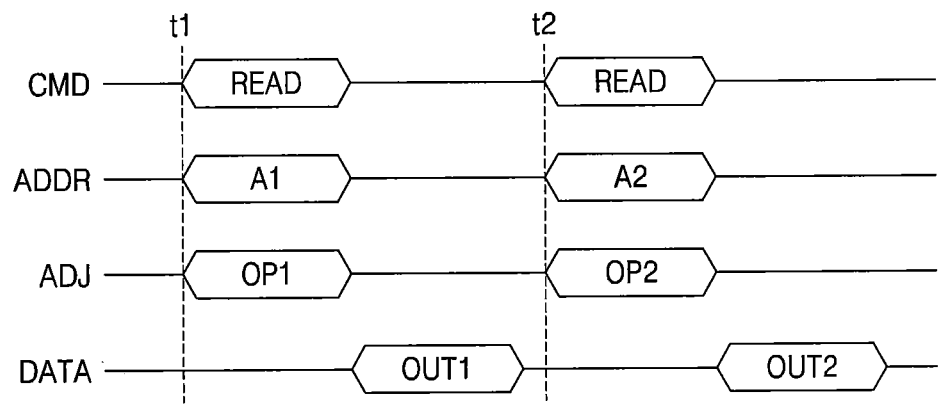
FIG. 2 is a timing diagram illustrating an example of communication between the memory device and the controller of FIG. 1, according to an example embodiment.

FIG. 1 is a block diagram illustrating a memory device 100 and a controller 200 according to an example embodiment, and FIG. 2 is a timing diagram showing an example of communication between the memory device 100 and the controller 200 of FIG. 1, according to an example embodiment.

Referring to FIG. 1, the memory device 100 may communicate with the controller 200. The memory device 100 may receive a command CMD such as a write command, a read command, and/or an address ADDR from the controller 200, and may receive data DATA (that is, write data) from the controller 200 and/or transmit data DATA (that is, read data) to the controller 200. In addition, as illustrated in FIG. 1, the memory device 100 may receive a reference adjustment signal ADJ from the controller 200. Although the command CMD, the address ADDR, the data DATA, and the reference adjustment signal ADJ are separately illustrated in FIG. 1, in some embodiments, at least two of the command CMD, the address ADDR, the data DATA, and/or the reference adjustment signal ADJ may be transmitted via a same channel. As illustrated in FIG. 1, the memory device 100 may include a cell array 110, a current source circuit 120, a reference resistor circuit 130, an amplification circuit 140, a control circuit 150, and/or a non-volatile memory (NVM) 160. As used herein, the term "and/or" includes any and all combinations of one or more of the associated listed items. Expressions such as "at least one of," when preceding a list of elements, modify the entire list of elements and do not modify the individual elements of the list.

The cell array 110 may include a plurality of memory cells M. A memory cell M may include a variable resistance element (for example, a magnetic tunnel junction (MTJ) illustrated in FIG. 3). The variable resistance element may have a resistance corresponding to a value stored in the memory cell M. Accordingly, the memory device 100 may be referred to as a resistive memory device, resistive random access memory (RRAM) (or ReRAM), and so on. For example, as a non-limited example, the memory device 100 may include a cell array 110 having a structure such as phase change random access memory (PRAM) or ferroelectric random access memory (FRAM), or a cell array having a magnetic random access memory (MRAM) structure, for example, spin transfer torque-magnetic random access memory (STT-MRAM), spin transfer torque magnetization switching RAM (Spin-RAM), and spin momentum transfer RAM (SMT-RAM). As will be described with reference to FIG. 3, example embodiments will be mainly described with reference to MRAM, but it should be noted that the example embodiments are not limited thereto.

The cell array 110 may include a reference cell R used for identifying values stored in the memory cells M. For example, as illustrated in FIG. 1, the cell array 110 may include the plurality of memory cells M and the reference cell R commonly connected to a word line WLi, and accordingly, the plurality of memory cells M and the reference cell R, which are commonly connected to the word line WLi, may simultaneously be selected by the word line WLi that is activated. Although only one reference cell R is illustrated in FIG. 1, in some embodiments, the cell array 110 may include more than two reference cells connected to the word line WLi.

The current source circuit 120 may provide a read current I_RD and a reference current I_REF to the cell array 110. For example, the current source circuit 120 may provide the read current I_RD to the memory cells M, and provide the reference current I_REF to the reference cell R. The current source circuit 120 may also adjust the reference current I_REF in response to a current control signal CC received from the control circuit 150. An example of the current source circuit 120 will be described with reference to FIG. 6.

The reference resistor circuit 130 may provide resistors through which the reference current I_REF passes. For example, the reference resistor circuit 130 may provide resistors having a reference resistance R_REF between a first node N1 and a second node N2. In addition, the reference resistor circuit 130 may adjust the reference resistance R_REF according to a resistance control signal RC received from the control circuit 150. The resistors of the reference resistor circuit 130 may have a characteristic different from a characteristic of one or more resistors formed in the cell array 110. In some embodiments, the resistors of the reference resistor circuit 130 may have a characteristic of being better, for example, more insensitive to process voltage temperature (PVT) changes, than one or more of the resistors formed in the cell array 110. Examples of the reference resistor circuit 130 will be described with reference to FIGS. 7A and 7B. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

The amplification circuit 140 may receive a read voltage V_RD and a reference voltage V_REF, and may, based on the read voltage V_RD and the reference voltage V_REF, identify the values stored in the memory cells M. For example, by comparing the read voltage V_RD to the reference voltage V_REF, the amplification circuit 140 may output signals corresponding to the values stored in the memory cells M. The read voltage V_RD may include a voltage drop caused due to the read current I_RD, which is provided by the current source circuit 120, passing through the variable resistance elements included in the memory cells M. The read voltage V_RD may, besides the voltage drop caused due to the memory cells M, further include a voltage drop generated due to parasitic resistance (for example, a column decoder 170a, a source line SLj, and a bit line BLj illustrated in FIG. 5A) of paths through which the read current I_RD passes.

Figure 5A:
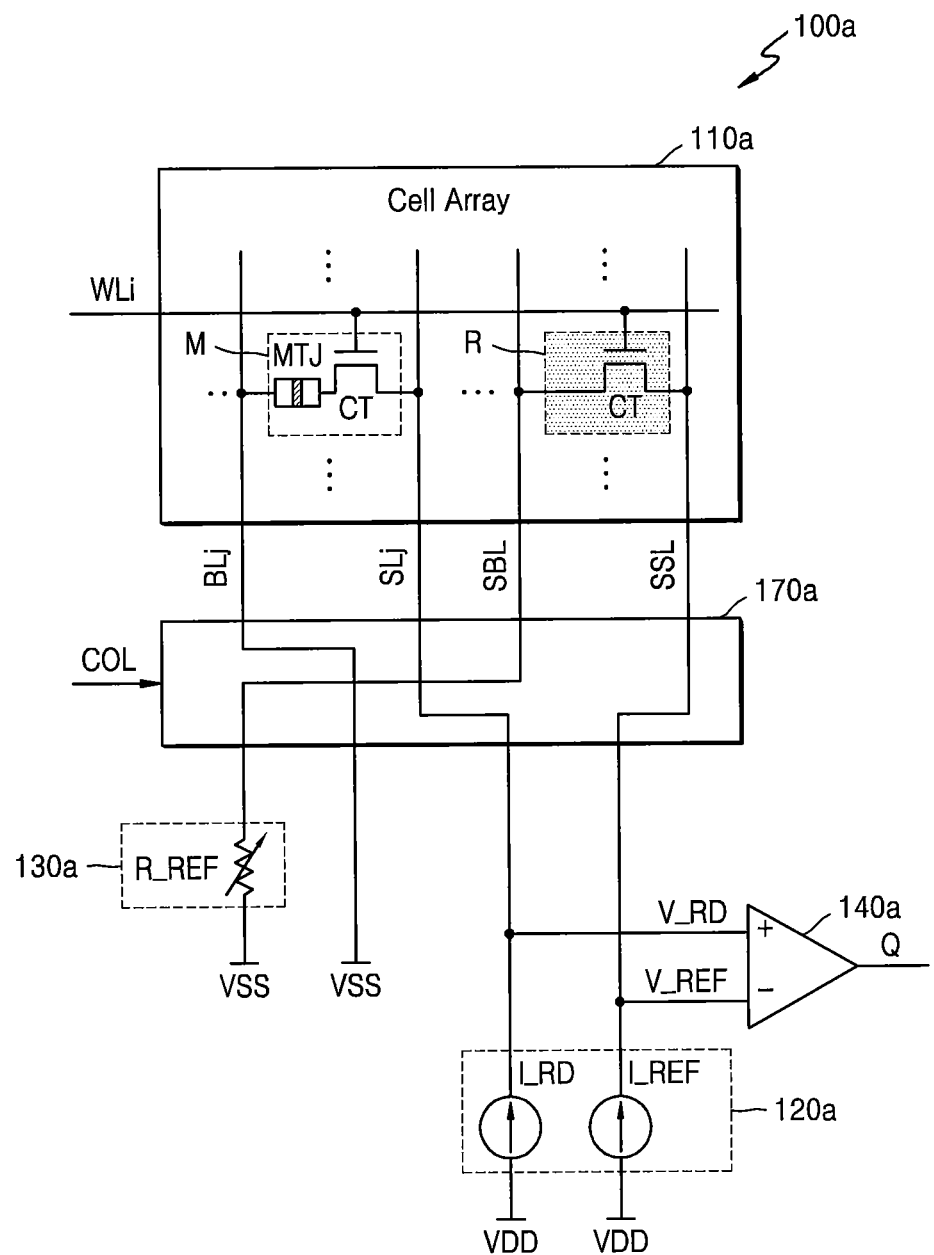
FIGS. 5A and 5B are block diagrams showing examples of the memory device of FIG. 1, according to example embodiments.

Similarly to the read voltage V_RD, the reference voltage V_REF may include not only a voltage drop, which is generated as the reference current I_REF provided by the current source circuit 120 passes through the reference cell R, but also a voltage drop generated by parasitic resistance (for example, the column decoder 170a, a short source line SSL, and a short bit line SBL illustrated in FIG. 5A) of paths through which the reference current I_REF passes. In addition, the reference voltage V_REF may further include a voltage drop generated due to the reference resistance R_REF provided by the reference resistor circuit 130.

Accordingly, by controlling the reference current I_REF and the reference resistance R_REF of the reference resistor circuit 130, the reference voltage V_REF may be adjusted, and a reference for identifying the values stored in the memory cells M may also be adjusted. In some embodiments, the reference resistance of a reference resistor may be monotonically increasing or monotonically decreasing. In particular, the reference resistance may be a monotonically increasing resistance that is repeatedly stepped-up during multiple read or write cycles. In some embodiments, the reference resistance may be a monotonically decreasing resistance that is repeatedly stepped-down during multiple read or write cycles. This monotonically increasing or decreasing reference resistance may be a stair-step sequence of resistance or a linear ramp-shaped sequence of resistance, for example.

As described with reference to FIG. 5A and subsequent figures, in some embodiments, the reference cell R may be a shorted cell that does not include a resistor element such as a variable resistance element. Accordingly, the reference voltage V_REF, due to a characteristic of the reference resistor circuit 130, may be insensitive to PVT changes. As will be described with reference to FIG. 8 and subsequent figures, when the reference voltage V_REF is accurately determined, the operation reliability of the memory device 100 may be increased.

The control circuit 150 may, by using the current control signal CC and the resistor control signal RC, respectively control the current source circuit 120 and the reference resistor circuit 130, and/or access the NVM 160. In some embodiments, the control circuit 150 may generate the current control signal CC and the resistor control signal RC, in response to a reference adjustment signal ADJ received from the controller 200. For example, based on the reference adjustment signal ADJ, the control circuit 150 may increase or decrease the reference current I_REF and increase or decrease the reference resistance R_REF of the reference resistor circuit 130. Consequentially, a reference voltage V_REF may be adjusted in response to the reference adjustment signal ADJ provided by the controller 200.

In some embodiments, to adjust the reference voltage V_REF, one of the reference current I_REF or the reference resistance R_REF of the reference resistor circuit 130 may be fixed. For example, when the reference current I_REF is fixed, the control circuit 150 may not generate the current control signal CC and adjust the reference resistance R_REF of the reference resistance circuit 130, by using the resistor control signal RC, according to the reference adjustment signal ADJ. On the other hand, when the reference resistance R_REF of the reference resistor circuit 130 is fixed, the control circuit 150 may not generate the resistor control signal RC and may adjust the reference current I_REF, by using the current control signal CC, according to the reference adjustment signal ADJ.

The NVM 160 may store data regarding the reference voltage V_REF. For example, the NVM 160 may store data regarding a read reference current, which is a reference current used for reading data from the memory cells M, and data regarding a read reference resistor, which is a reference resistor used for reading data from the memory cells M. For example, control data corresponding to the read reference current may be written to the resistive memory. In some embodiments, the control circuit 150 may, in response to a command CMD that commands setting of a reference voltage V_REF (or a setting command) received from the controller 200, write data regarding the reference voltage V_REF to the NVM 160, and in response to a command CMD controlling a read operation of data (or a read command), generate a current control signal CC and a resistance control signal RC according to the data stored in the NVM 160. In some embodiments, the NVM 160 may be omitted. For example, at least some of the memory cells M included in the cell array 110 may store data regarding the reference voltage V_REF and be accessed by the control circuit 150.

The controller 200 may include a reference trimmer 210. The reference trimmer 210 may adjust the reference voltage V_REF of the memory device 100 by using the reference adjustment signal ADJ. Based on results of reading data from the memory cells M according to the adjusted reference voltage V_REF, the reference trimmer 210 may help determine the reference voltage V_REF, which may be a read reference voltage to be used for reading data from the memory cells M.

In some embodiments, the reference adjustment signal ADJ may be synchronized with the read command READ. That is, the reference adjustment signal ADJ may occur at the same time, overlapping in time as the read command READ, or preceded or followed by the read command READ, to be provided to the memory device 100. For example, as illustrated in FIG. 2, the controller 200 may, by using the command CMD, the address ADDR, and the reference adjustment signal ADJ, provide the read command READ, a first address A1, and a first option OP1 to the memory device 100 beginning at time t1. The control circuit 150 of the memory device 100 may generate the current control signal CC and the resistance control signal RC according to the first option OP1, and accordingly, the reference current I_REF and the reference resistance R_REF of the reference resistor circuit 130 may be determined. According to the read command READ, memory cells M and the reference cell R corresponding to the first address A1 may be selected. Also, by a read voltage V_RD according to the memory cells M and a reference voltage V_REF according to the reference resistance R_REF of the reference resistor circuit 130, values stored in the memory cells M may be identified. The identified values may, via data DATA, be provided to the controller 200 as first output OUT1. Similarly, at time t2, in response to the read command READ, a second address A2, and a second option OP2 of the controller 200, the memory device 100 may provide a second output OUT2 to the controller 200. In some embodiments, unlike shown in FIG. 2, the reference adjustment signal ADJ may be synchronized with an exclusive command, which is a command different from the read command READ, and be provided to the memory device 100.

In some embodiments, according to reference voltages that monotonically increase or decrease, the reference trimmer 210 may read data from the plurality of memory cells to which predetermined values are written, and determine a read reference voltage, based on results of reading. In particular, the reference voltage may be a monotonically increasing voltage that is repeatedly stepped-up during multiple read or write cycles. In some embodiments, the reference voltage may be a monotonically decreasing voltage that is repeatedly stepped-down during multiple read or write cycles. This monotonically increasing or decreasing reference voltage may be a stair-step sequence of voltages or a linear ramp-shaped sequence of voltages, for example.

As described above, by controlling the reference cell R, an accurate threshold resistance of the memory cells M may be induced, as it will be described later, and values stored in the memory cells M may be accurately read. In addition, as the accurate threshold resistance is promptly detected, improved productivity of the memory device 100 may be provided, and according to an operation environment of the memory device 100, adaptive calibration may be provided.

Figure 3:
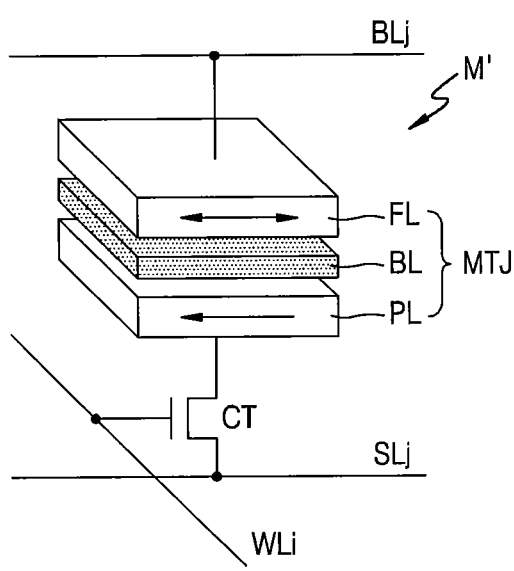
FIG. 3 is a diagram illustrating an example of a memory cell illustrated in FIG. 1, according to example embodiments.
Figure 4:
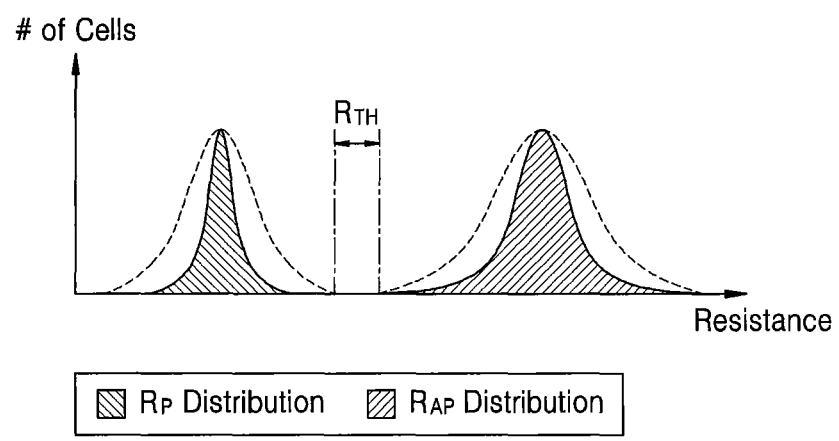
FIG. 4 is a graph showing distribution of resistances provided by the memory cell illustrated in FIG. 3, according to example embodiments.

FIG. 3 is a drawing showing an example of the memory cell M of FIG. 1, according to an example embodiment, and FIG. 4 is a graph illustrating distributions of resistances provided by the memory cell M illustrated in FIG. 3, according to some example embodiments. Referring now to FIG. 3, a memory cell M' including a magnetic tunnel junction (MTJ) element as a variable resistance element is illustrated. FIG. 4 shows distributions of resistances for the MTJ element configured as the variable resistance element of FIG. 3.

As shown in FIG. 3, the memory cell M' may include the variable resistance element (MTJ element) and a cell transistor CT serially connected between a bit line BLj and a source line SLj. In some embodiments, as shown in FIG. 3, between the bit line BLj and the source line SLj, the variable resistance element (MTJ element) and the cell transistor CT may be connected in the order of the variable resistance element (MTJ element) and the cell transistor CT. In some embodiments, unlike shown in FIG. 3, between the bit line BLj and the source line SLj, the variable resistance element (MTJ element) and the cell transistor CT may be connected in the order of the cell transistor CT and the variable resistance element (MTJ element).

The variable resistance element (MTJ element) may include a free layer FL and a pinned layer PL, and a barrier layer BL between the free layer FL and the pinned layer PL. As marked with arrows in FIG. 3, while a magnetization direction of the pinned layer PL may be fixed, the free layer FL may have a magnetization that is equal to or opposite to the magnetization direction of the pinned layer PL. When the pinned layer PL and the free layer FL have identical magnetization directions, the variable resistance element (MTJ element) may be referred to be in a parallel state P. On the other hand, when the pinned layer PL and the free layer FL have magnetization directions different from one another, the variable resistance element (MTJ element) may be referred to be in an anti-parallel state AP. In some embodiments, the variable resistance element (MTJ element) may further include an anti-ferromagnetic layer so that the pinned layer PL may have a fixed magnetization direction.

The variable resistance element (MTJ element), which may have a low resistance $R_P$ in the parallel state P, may have a high resistance $R_{AP}$ in the anti-parallel state AP. In the specification, it is assumed that when the variable resistance element (MTJ element) has a low resistance $R_P$ the memory cell M' stores '0', and when the variable resistance element (MTJ element) has a high resistance $R_{AP}$, the memory cell M' stores '1'. Also, in the specification, the resistance $R_P$ corresponding to '0' may be referred to as a parallel resistance $R_P$, and the resistance $R_{AP}$ corresponding to '1' may be referred to as an anti-parallel resistance $R_{AP}$. However, various embodiments described herein may apply to the opposite storage case as well.

Referring to FIG. 4, resistances of the variable resistance elements MTJ may have distributions. For example, as shown in FIG. 4, there may be a parallel resistance $R_P$ distribution (or a first distribution) between the memory cells storing '0', and there may be an anti-parallel resistance $R_{AP}$ distribution (or a second distribution) between the memory cells storing '1'. In some embodiments, as shown in FIG. 4, the anti-parallel resistance $R_{AP}$ distribution may be degraded, that is, have a higher variance, compared to the parallel resistance $R_P$ distribution. In other words, some values of the higher portion of the parallel resistance $R_P$ distribution may be close to values in a lower portion of the anti-parallel resistance $R_{AP}$ distribution. Also, as marked with dash lines in FIG. 4, due to various causes, the distributions of the resistances of the variable resistance elements (MTJ element) may be degraded. Accordingly, a range of a threshold resistance $R_{TH}$ for distinguishing the parallel resistance $R_P$ distribution from the anti-parallel resistance $R_{AP}$ distribution may be reduced, and it may be important to determine an accurate threshold resistance $R_{TH}$. As it will be described later with reference to FIGS. 8 through 13, according to example embodiments, by controlling the reference cell R, distributions of resistances of the variable resistance elements MTJ may be estimated, and based on the estimated distributions, a threshold resistance $R_{TH}$ may be determined.

Referring again to FIG. 3, the cell transistor CT may include a gate connected to the word line WLi, a source and a drain respectively connected to the source line SLi and the variable resistance element (MTJ element). The cell transistor CT may, according to a signal applied to the word line WLi, electrically connect or block the variable resistance element (MTJ element) and the source line SLj. For example, in a write operation, to write '0' to the memory cell M', the cell transistor CT may be turned on, and a current flowing from the bit line BLj to the source line SLj may pass through the variable resistance element (MTJ element) and the cell transistor CT. To write '1' to the memory cell M', the cell transistor CT may be turned on, and a current flowing from the source line SLj to the bit line BLj may pass through the cell transistor CT and the variable resistance element (MTJ element). In a read operation, the cell transistor CT may be turned on, and a current flowing from the bit line BLj to the source line SLj or a current flowing from the source line SLj to the bit line BLj, that is, the read current I_RD, may pass through the cell transistor CT and the variable resistance element (MTJ element). In various embodiments described herein, it is assumed that the read current I_RD flows from the source line SLj to the bit line BLj.

Figure 5B:
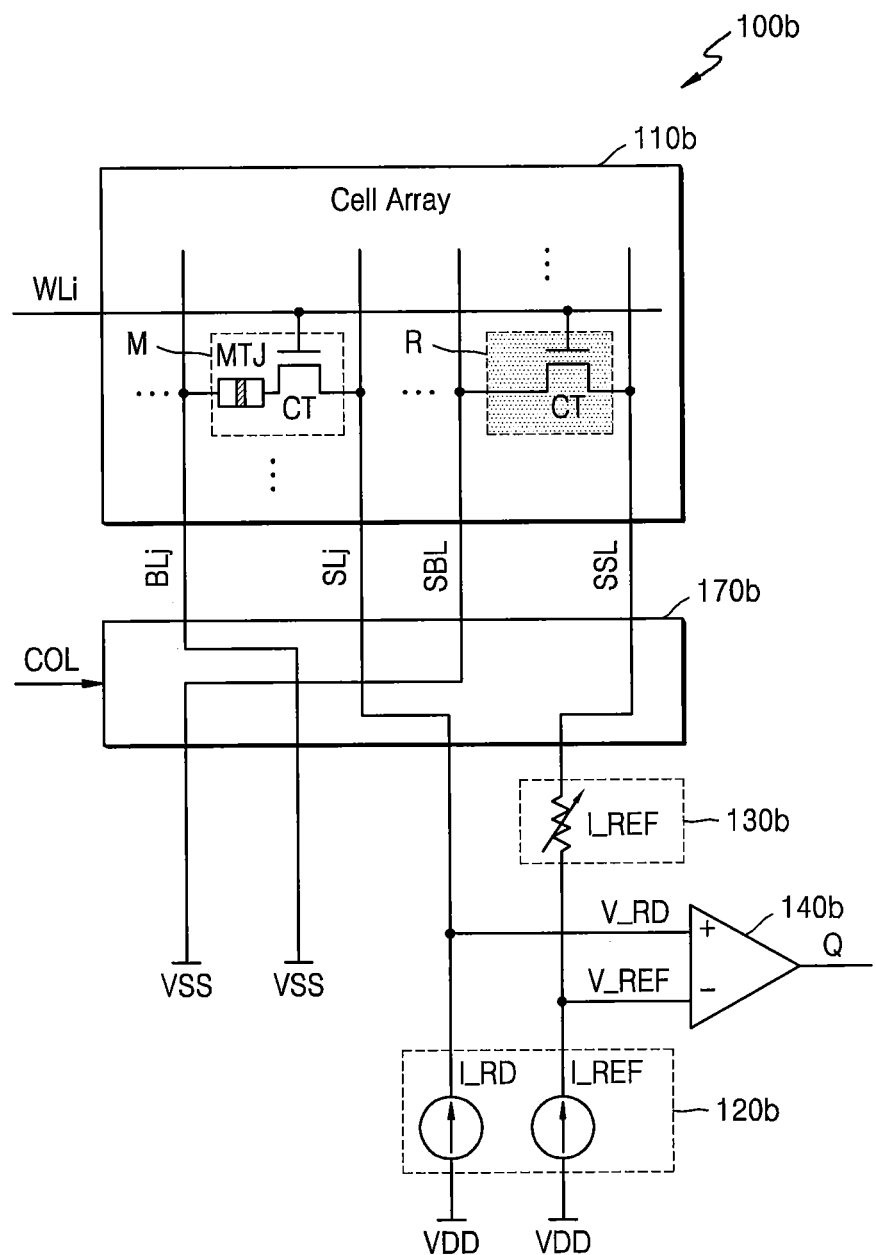

FIGS. 5A and 5B are block diagrams showing examples of the memory device 100 of FIG. 1, according to example embodiments. Referring now to FIGS. 5A and 5B, FIGS. 5A and 5B respectively show memory devices 100a and 100b during read operations. In memory devices 100a and 100b, reference resistor circuits 130a and 130b may be arranged differently from one another. Hereinafter, FIGS. 5A and 5B will be described with reference to FIG. 1. Among descriptions of FIGS. 5A and 5B, descriptions overlapping with those of FIG. 1 are omitted for brevity.

Referring to FIG. 5A, memory device 100a may include a cell array 110a, a current source circuit 120a, a reference resistor circuit 130a, an amplification circuit 140a, and a column decoder 170a. The cell array 110a may include memory cells M and the reference cell R which are connected to the word line WLi in common. Each memory cell M may be connected to a bit line BLj and a source line SLj, and the reference cell R may be connected to a short bit line SBL and a short source line SSL. The bit line BLj, the source line SLj, the short bit line SBL, and the short source line SSL may extend to and be connected to the column decoder 170a.

While the memory cell M may include the variable resistance element (MTJ element) and the cell transistor CT that are serially connected between the bit line BLj and the source line SLj, the reference cell R may include the cell transistor CT connected to the short bit line SBL and the short source line SSL. Accordingly, the cell transistor CT of the reference cell R, the short bit line SBL and the short source line SSL may be electrically shorted or opened. The reference cell R that does not include a resistance element may be referred to as a shorted cell. To compensate for a voltage drop caused due to the bit line BLj and the source line SLj connected to the memory cell M, as shown in FIG. 5A, the reference cell R, which is connected to the short bit line SBL and the short source line SSL, may be arranged as in the cell array 110a. As shown in FIG. 5A, the reference cell R may be a shorted cell. Accordingly, a voltage drop caused due to the variable resistance element (MTJ element) of the memory cell M may be compared to a voltage drop caused due to a reference resistor circuit 130a arranged outside of the cell array 110a. Being free from spatial and structural limits of the cell array 110, the reference resistor circuit 130a, which is arranged outside of the cell array 110a, may provide a reference resistance R_REF that has a wide variable range and may be insensitive to PVT and the like, such that reference voltage V_REF may be more accurately adjusted.

The column decoder 170a may, according to a column address COL, perform routing on the bit line BLj, the source line SLj, the short bit line SBL, and the short source line SSL. The column address COL may be generated due to the address ADDR received from the controller 200 of FIG. 1. The column decoder 170a may select at least some of the memory cells and the reference cells that are selected according to the activated word line WLi in the cell array 110a, according to the column address COL. For example, as shown in FIG. 5A, the column decoder 170a may connect the bit line BLj of the memory cell M to a negative supply voltage source VSS, and connect the source line SLj to the current source circuit 120a. In addition, the column decoder 170a may connect the short bit line SBL of the reference cell R to the reference resistor circuit 130a, and connect the short source line SSL to the current source circuit 120a. Accordingly, the read current I_RD may pass through the source line SLj, the memory cell M, and the bit line BLj and flow toward the negative supply voltage source VSS. The reference current I_REF may pass through the short source line SSL, the reference cell R, the short bit line SBL, and the reference resistor circuit 130a, and flow toward the negative supply voltage source VSS.

The amplification circuit 140a may be connected to nodes through which the read current I_RD and the reference current I_REF are respectively output from the current source circuit 120a. The amplification circuit 140a may generate an output signal Q according to the read voltage V_RD and the reference voltage V_REF at the nodes. While the read voltage V_RD may be determined by a resistance of the variable resistance element (MTJ element) in the memory cell M and the read current I_RD, the reference voltage V_REF may be determined by the reference resistance R_REF and the reference current I_REF. When the read voltage V_RD is higher than the reference voltage V_REF (that is, when a resistance of the variable resistance element (MTJ element) of the memory cell M is greater than a threshold resistance $R_{TH}$), the amplification circuit 140a may generate an output signal Q corresponding to '1'. When the read voltage V_RD is lower than the reference voltage V_REF (that is, when the resistance of the variable resistance element (MTJ element) of the memory cell M is less than the threshold resistance $R_{TH}$), the amplification circuit 140a may generate an output signal Q corresponding to '0'.

Referring to FIG. 5B, the memory device 100b may include a cell array 110b, a current source circuit 120b, a reference resistor circuit 130b, an amplification circuit 140b, and a column decoder 170b. Compared to the memory device 100a of FIG. 5A, the memory device 100b of FIG. 5B may optionally further include the reference resistor circuit 130b arranged between the column decoder 170b and the current source circuit 120b. Accordingly, the reference current I_REF may pass through the reference resistor circuit 130b, the short source line SSL, the reference cell R, and the short bit line SBL and flow toward the negative supply voltage source VSS. Hereinafter, example embodiments will be described mainly with reference to cases, like the memory device 100a of FIG. 5A, in which the reference resistor circuit 130a is arranged between the reference cell R and the negative supply voltage source VSS, but example embodiments are not limited thereto.

Figure 6:
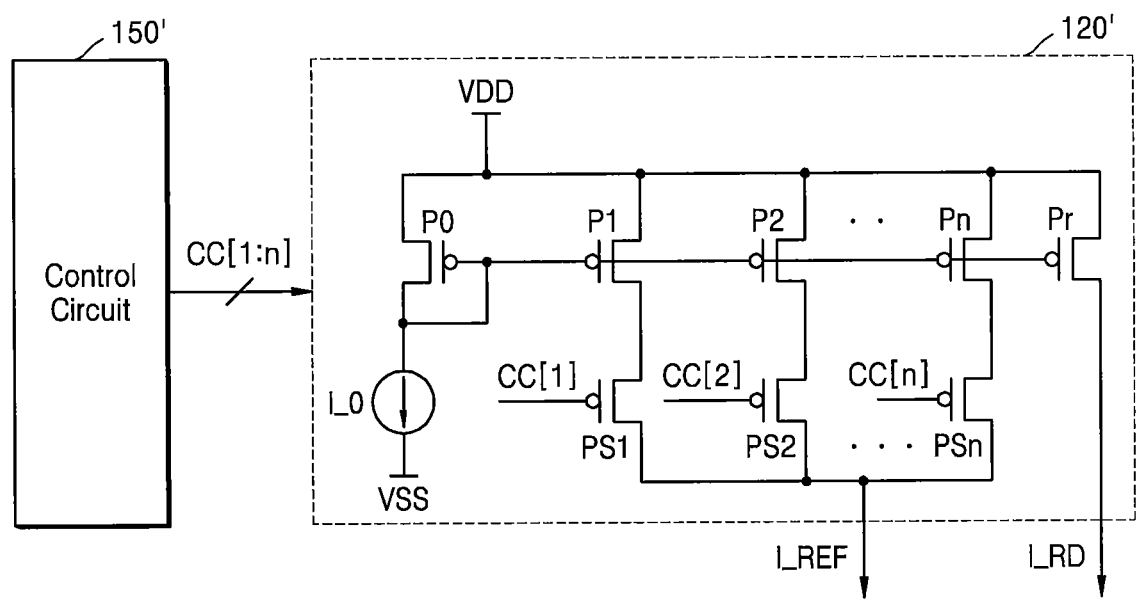
FIG. 6 is a circuit diagram showing an example of a current source circuit illustrated in FIG. 1, according to example embodiments.

FIG. 6 is a circuit diagram showing the current source circuit 120 of FIG. 1, according to some example embodiments. As described above with reference to FIG. 1, a current source circuit 120' illustrated in FIG. 6 may generate the read current I_RD and the reference current I_REF, and when n is a positive integer, the current source circuit 120' may adjust the reference current I_REF according to current control signals CC[1:n] of a control circuit 150'.

Referring to FIG. 6, the current source circuit 120' may include a plurality of transistors P0, P1, P2 through Pn, Pr having sources connected in common to a positive supply voltage VDD. The plurality of transistors P0, P1, P2 through Pn, Pr may be PMOS transistors and form current mirrors. Therefore, according to a current I_0 flowing through the transistor P0 and respective sizes of the plurality of transistors P0, P1, P2 through Pn, Pr, a magnitude of a current being withdrawn from the positive supply voltage VDD may be determined. In some embodiments, the transistor P0 and the transistor Pr may have identical sizes. Accordingly, the read current I_RD may have a magnitude that is substantially identical to a magnitude of the current I_0.

The n transistors P1, P2 through Pn generating the reference current I_REF may be respectively and serially connected to n transistors PS1, PS2 through PSn controlled by the current control signals CC[1:n]. The current control signals CC[1:n] may respectively be applied to gates of the n transistors PS1, PS2 through PSn, and thus, by the current control signals CC[1:n], a magnitude of the reference current I_REF may be determined. For example, when the transistor PS1 is turned on in response to a first current control signal CC[1] of a low level, a current passing through the transistor P1 may be included in the reference current I_REF. When the transistor PS1 is turned off in response to a first current control signal CC[1] of a high level, the current passing through the transistor P1 may be excluded from the reference current I_REF. The n transistors P1, P2, through Pn may have identical sizes in some embodiments and may have different sizes in some embodiments.

Figure 7A:
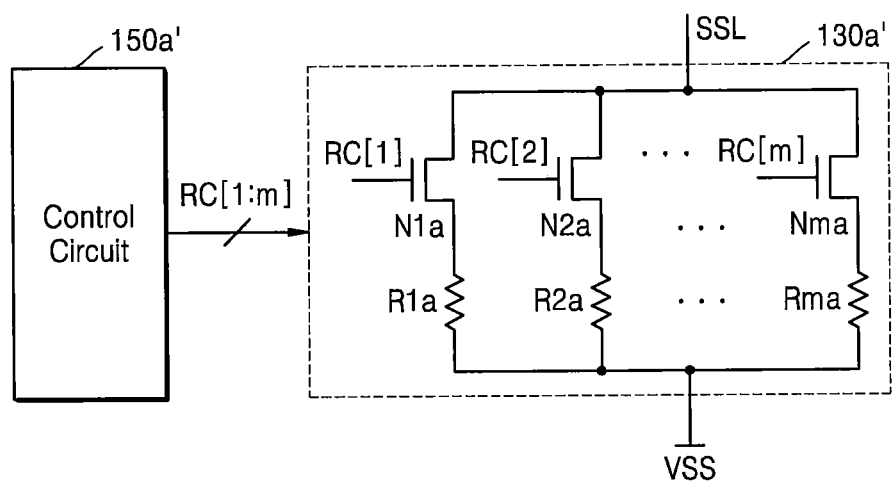
FIGS. 7A and 7B are circuit diagrams showing examples of a reference resistor circuit illustrated in FIG. 1, according to example embodiments.
Figure 7B:
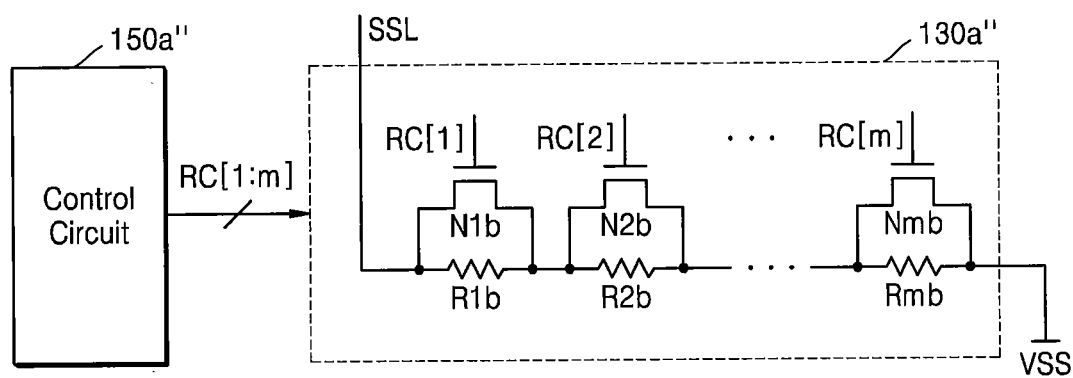

FIGS. 7A and 7B are circuit diagrams showing the reference resistor circuit 130 of FIG. 1, according to example embodiments. As described with reference to FIG. 1, reference resistor circuits 130a' and 130a" of FIGS. 7A and 7B may respectively provide a resistor through which the reference current I_REF passes, and when m is a positive integer, in response to resistor control signals RC[1:m] of control circuits 150a' and 150a", a resistance of the resistor, which is the reference resistance R_REF, may be adjusted. The reference resistor circuits 130a' and 130a" of FIGS. 7A and 7B may, as described with reference to FIG. 5A, respectively provide the resistor having the reference resistance R_REF between the short source line SSL and the negative supply voltage source VSS. Hereinafter, among descriptions of FIGS. 7A and 7B, overlapped descriptions will not be given.

Referring to FIG. 7A, the reference resistor circuit 130a' may, between the short source line SSL and the negative supply voltage source VSS, include a plurality of resistors R1a, R2a through Rma, and a plurality of transistors N1a, N2a through Nma which are respectively and serially connected to the plurality of resistors R1a, R2a through Rma. The resistor control signals RC[1:m] may be applied to gates of the plurality of transistors N1a, N2a through Nma, and accordingly, the reference resistance R_REF may be determined by the resistor control signals RC[1:m]. For example, when the transistor N1a is turned on in response to a first resistor control signal RC[1] of a high level, the reference resistance R_REF may be determined by the first resistor R1a; when the transistor N1a is turned off in response to a first resistor control RC[1] of a low level, the reference resistance R_REF may be determined regardless of the first resistor R1a. Consequentially, the reference resistance R_REF of the reference resistor circuit 130a' may be determined by an equivalent circuit that is made by connecting, in parallel, the resistors selected by the resistor control signals RC[1:m] from among the plurality of resistors R1a, R2a through Rma.

Referring to FIG. 7B, the reference resistor circuit 130a" may include a plurality of resistors R1b, R2b through Rmb serially connected between the short source line SSL and the negative supply voltage source VSS, and a plurality of transistors N1b, N2b through Nmb which are respectively connected in parallel to the plurality of resistors R1b, R2b through Rmb. The resistor control signals RC[1:m] may be applied to gates of the plurality of transistors N1b, N2b through Nmb, and accordingly, by the resistor control signals RC[1:m], a reference resistance R_REF may be determined. For example, when the transistor N1b is turned off in response to the first resistor control signal RC[1] of the low level, the reference resistance R_REF includes a resistance of a first resistor R1b; when the transistor N1b is turned on in response to the first resistor control signal RC[1] of the high level, the reference resistance R_REF, when a turn-on resistance of the transistor N1b is approximately 0, may not include a resistance of the first resistor R1b. Consequentially, the reference resistance R_REF of the reference resistor circuit 130a" may be determined by an equivalent circuit that is made by connecting, in series, the resistors selected by the resistor control signals RC[1:m] among the plurality of resistors Rib, R2b through Rmb.

Figure 8:
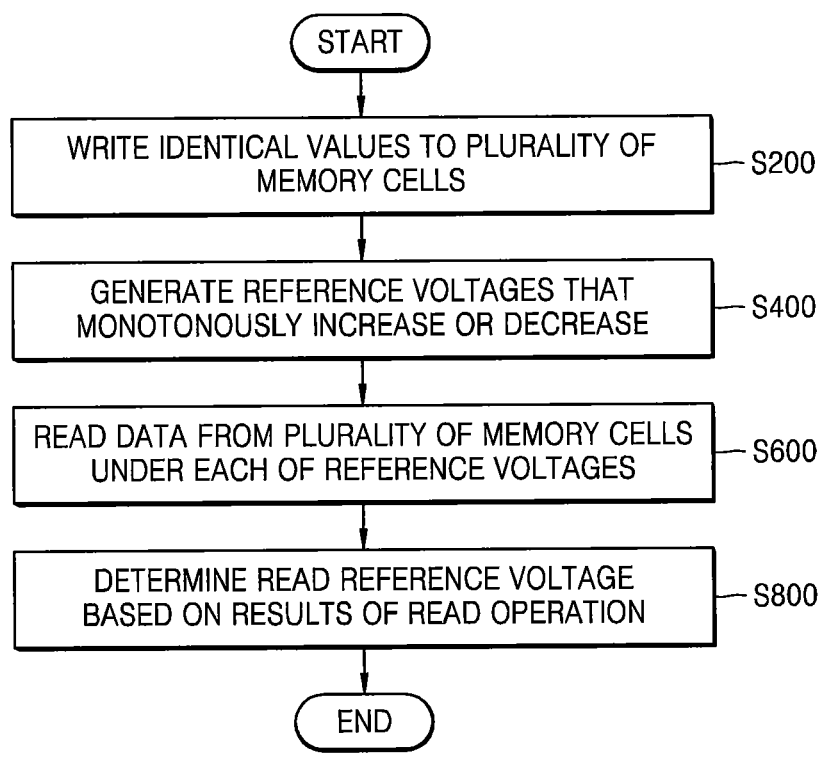
FIG. 8 is a flowchart showing a method of controlling a reference cell, according to example embodiments.

FIG. 8 is a flowchart showing a method of controlling the reference cell, according to example embodiments. As illustrated in FIG. 8, the method of controlling the reference cell may include a plurality of operations S200, S400, S600, and S800. In some embodiments, for controlling the reference cell R included in the memory device 100 of FIG. 1, the method described with reference to FIG. 8 may be performed by the controller 200 including the reference trimmer 210. Hereinafter, FIG. 8 will be described with reference to FIG. 1.

In operation S200, an operation of writing identical values to a plurality of memory cells may be performed. For example, an operation of writing '0' or '1' to the plurality of memory cells may be performed. According to the values written to the plurality of memory cells, in the following operation S400, a method of controlling a reference voltage may be determined. The example of writing '0' to the plurality of memory cells will be described later with reference to FIG. 9A, and the example of writing '1' to the plurality of memory cells will be described later with reference to FIG. 9B.

In operation S400, an operation of generating reference voltages that monotonically increase or decrease may be performed. For example, in the operation S200, when '0' corresponding to the parallel resistance $R_P$ of the variable resistance elements is written to the plurality of memory cells, reference voltages that monotonically increase from a minimum reference voltage may be generated. On the other hand, in the operation S200, when '1' corresponding to the anti-parallel resistances $R_{AP}$ of the variable resistance elements is written to the plurality of memory cells, reference voltages that monotonically decrease from a maximum reference voltage may be generated.

In operation S600, operations of reading data from the plurality of memory cells under each of the reference voltages may be performed. For example, an operation of reading data from the plurality of memory cells under respective reference voltages that monotonically increase may be performed, or an operation of reading data from the plurality of memory cells under respective reference voltages that monotonically decrease may be performed. The examples of the operations S200 through S600 will be described with reference to FIGS. 9A and 9B.

In operation S800, an operation of determining a read reference voltage, based on reading results, may be performed. In some embodiments, from results of reading data from the plurality of memory cells to which '0' is written under each of the monotonically increasing reference voltages or monotonically decreasing reference currents, a parallel resistance $R_P$ distribution (or a first distribution) of the variable resistance elements may be estimated. In some embodiments, from results of reading data from the plurality of memory cells to which '1' is written under each of the monotonically decreasing reference voltages or monotonically increasing reference currents, an anti-parallel resistance $R_{AP}$ distribution (or a second distribution) may be estimated. Based on at least one of the estimated distributions, a threshold resistance $R_{TH}$ may be determined, from which a read reference voltage may be determined. The examples of the operation S800 will be described with reference to FIGS. 10 through 13.

Figure 9A:
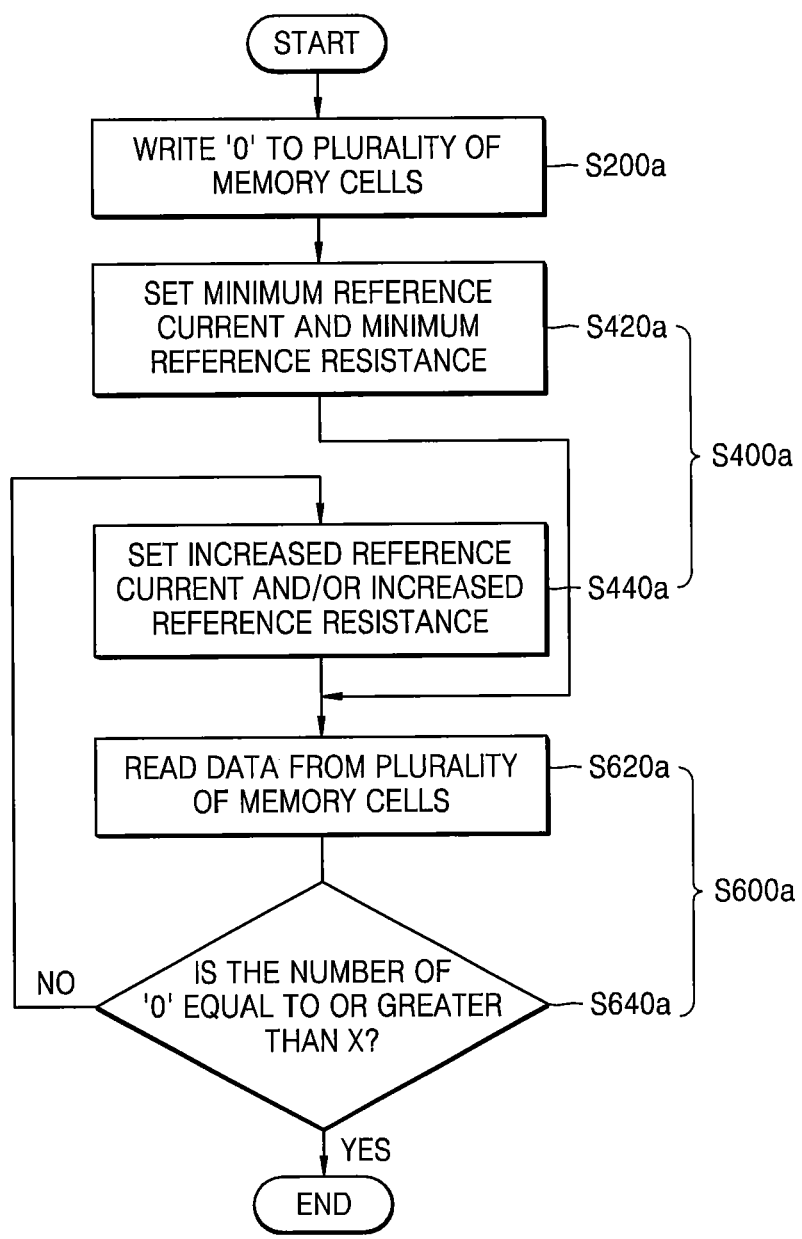
FIGS. 9A and 9B are flowcharts showing examples of operations S200 through S600 shown in FIG. 8, according to example embodiments.
Figure 9B:
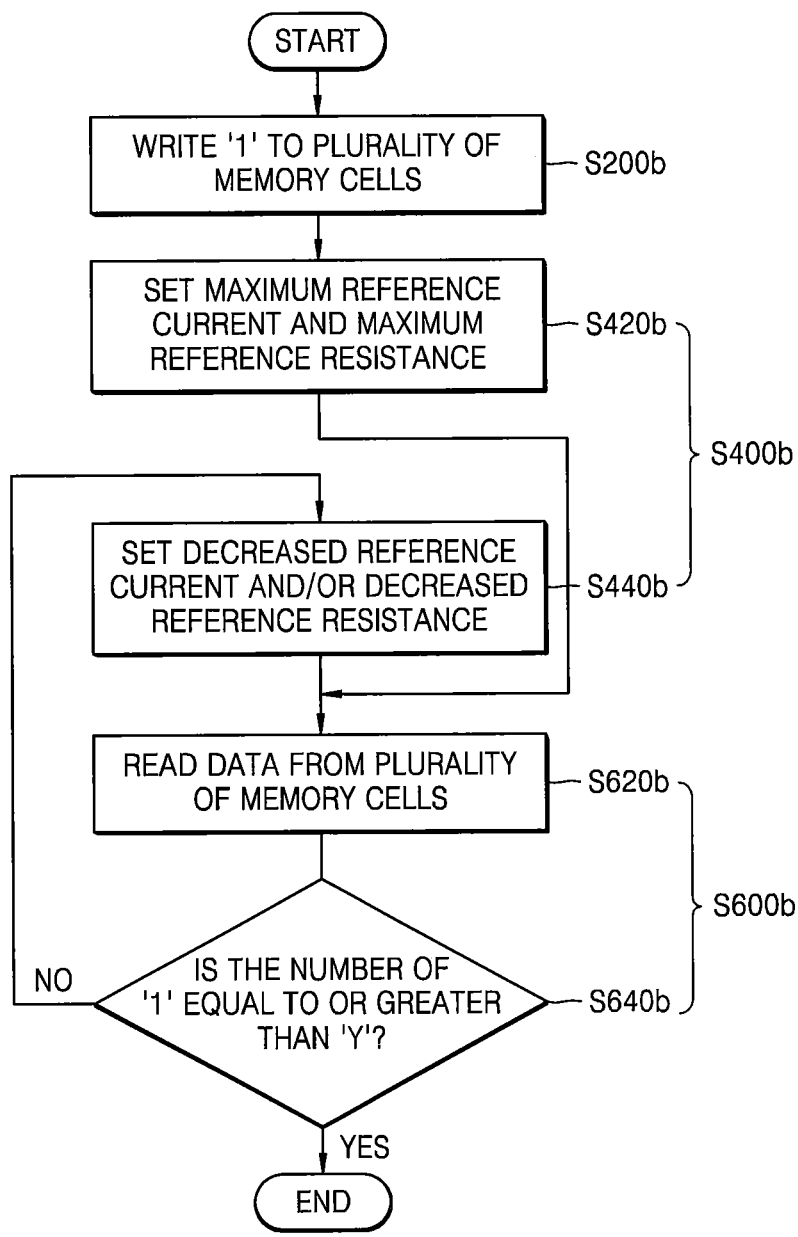

FIGS. 9A and 9B are flowcharts showing examples of the operations S200 through S600 of FIG. 8, according to example embodiments. As described above with reference to FIG. 8, in operations S200a and S200b of FIGS. 9A and 9B, the operation of writing identical values to the plurality of memory cells may be performed. In operations S400a and S400b, the operation of generating the reference voltages that monotonically decrease or increase may be performed. In operations S600a and S600b, the operation of reading data from a plurality of memory cells under each of the reference voltages may be performed. Hereinafter, FIGS. 9A and 9B will be described with reference to FIG. 1 and FIG. 4, which shows the distributions of the resistances of the variable resistance elements, and among descriptions of FIGS. 9A and 9B, overlapped descriptions will be omitted.

Referring to FIG. 9A, in the operation S200a, the operation of writing '0' to the plurality of memory cells may be performed. For example, the controller 200 may transmit the command CMD that commands writing, the address ADDR corresponding to the plurality of memory cells, and the data DATA including '0' to the memory device 100. Accordingly, the plurality of memory cells may have resistances distributed like the parallel resistance $R_P$ distribution of FIG. 4. In some embodiments, in the cell array 110, '0' may be written to the plurality of memory cells connected to one same word line WLi.

The operation S400a may include an operation S420a and an operation S440a. In the operation S420a, an operation of setting a minimum reference current and a minimum reference resistance may be performed. For example, the controller 200 may transmit the reference adjustment signal ADJ, which corresponds to the minimum reference current and the minimum reference resistance, to the memory device 100. The control circuit 150 of the memory device 100 may, by generating the current control signal CC and the resistor control signal RC in response to the reference adjustment signal ADJ, set the reference current I_REF and the reference resistance R_REF respectively as minimum values. Accordingly, a reference voltage V_REF determined by the reference current I_REF and the reference resistance R_REF may respectively have a minimum value, and a threshold resistance $R_{TH}$ corresponding to the reference voltage V_REF may be lower than a mean of the parallel resistance $R_P$ distribution.

In some embodiments, the reference current I_REF and the reference resistance R_REF may not be set as minimum values. For example, based on variations in the parallel resistance $R_P$ distribution, an arbitrary reference current I_REF and an arbitrary reference resistance R_REF may be set for a reference voltage V_REF corresponding to a threshold resistance $R_{TH}$ which is lower than the mean of the parallel resistance $R_P$ distribution. As shown in FIG. 9A, in some embodiments, after the operation S420a, an operation S620a may be performed.

In operation S620a, an operation of reading data from a plurality of memory cells may be performed. For example, the controller 200 may transmit the command CMD, which commands the reading operation, and the address ADDR, corresponding to the plurality of memory cells, to the memory device 100. In some embodiments, as described above with reference to FIG. 2, the command CMD for the read operation and the address ADDR may be synchronized with the reference adjustment signal ADJ for setting the minimum reference current and the minimum reference resistance of the operation S420a and be transmitted to the memory device 100. The memory device 100 may transmit data DATA including results of reading data from the memory cells to which '0' is written, by using the minimum reference voltage according to the minimum reference current and the minimum reference resistance that have been set, to the controller 200.

In operation S640a, based on the number of '1''s included in the result of reading, an operation of determining whether to re-perform the read operation of the plurality of memory cells may be performed. For example, as shown in FIG. 9A, the reference trimmer 210 of the controller 200 may compare the number of '0's included in the data DATA received from the memory device 100, which is the number of memory cells from which the stored values are read to be '0', with a preset value 'X', (X>0). When the number of '0' is equal to or greater than 'X', the operations of setting the reference current and the reference resistance and reading data from the plurality of memory cells may be ceased, and otherwise, the operation S440a may be performed after the operation S640a. In other words, until '0' is read from a certain number of memory cells from among the plurality of memory cells to which '0' is written, the operation of setting the reference current I_REF and the reference resistance R_REF and the operation of reading data from the plurality of memory cells may be repeated. In some embodiments, 'X' may be equal to the number of the memory cells to which '0' is written, and in some embodiments, 'X' may be half the number of the memory cells to which '0' is written.

In operation S440a, an operation of setting an increased reference current and/or an increased reference resistance may be performed. For example, the controller 200 may transmit a reference adjustment signal ADJ, which corresponds to an increased reference current and/or an increased reference resistance, to the memory device 100, and the control circuit 150 of the memory device 100 may, by generating a current control signal CC and/or a resistor control signal RC in response to the reference adjustment signal ADJ, set the increased reference current I_REF and the increased reference resistance R_REF. Accordingly, a reference voltage V_REF may also increase, and a threshold resistance $R_{TH}$ corresponding to the reference voltage V_REF may, from the parallel resistance $R_P$ distribution of FIG. 4, move to the right in the graph.

When the operations S440a and S600a are repeated, according to a reference voltage V_REF that gradually increases, a threshold resistance $R_{TH}$ may, from the parallel resistance $R_P$ distribution, move to the right in the graph of FIG. 4. Accordingly, as the threshold resistance $R_{TH}$ moves from the left to the right of the parallel resistance $R_P$ distribution, the parallel resistance $R_P$ distribution may be estimated. After the operation S600a, operations of estimating the distributions and determining a read reference voltage from the estimated distributions, such as in examples of the operation S800 of FIG. 8, will be described after with reference to FIGS. 10 through 13.

Referring to FIG. 9B, in the operation S200b, an operation of writing '1' to the plurality of memory cells may be performed. Accordingly, the plurality of memory cells may have resistances distributed like the anti-parallel resistance $R_{AP}$ distribution of FIG. 4.

An operation S400b may include an operation S420b and an operation S440b. In the operation S420b, an operation of setting a maximum reference current and a maximum reference resistance may be performed. For example, the controller 200 may transmit a reference adjustment signal ADJ, which corresponds to the maximum reference current and the maximum reference resistance, to the memory device 100, and the control circuit 150 of the memory device 100. The control circuit 150 may, by generating a current control signal CC and a reference control signal RC in response to the reference adjustment signal ADJ, set maximum values respectively for the reference current I_REF and the reference resistance R_REF. Accordingly, a reference voltage V_REF, which is determined by the reference current I_REF and the reference resistance R_REF, may have a maximum value, and a threshold resistance $R_{TH}$ corresponding to the reference voltage V_REF may be higher than a mean of the anti-parallel resistance $R_{AP}$ distribution.

In some embodiments, the reference current I_REF and the reference resistance R_REF may not be set as maximal values. For example, based on variations in the anti-parallel resistance $R_{AP}$ distribution, a reference current I_REF and a reference resistance R_REF may be set for a reference voltage V_REF corresponding to a threshold resistance $R_{TH}$ which is higher than an average of the anti-parallel resistance $R_{AP}$ distribution may have. As shown in FIG. 9B, an operation S620b may be performed after the operation S420b.

In operation S620b, an operation of reading data from the plurality of memory cells may be performed. Accordingly, the memory device 100 may transmit data DATA including results of reading data from the memory cells to which '1' is written by using the maximum reference voltage according to the maximum reference current and the maximum reference resistance to the controller 200.

In operation S640*b*, based on the number of '1' included in the result of reading, an operation of determining whether to re-perform the read operation on the plurality of memory cells may be performed. For example, as shown in FIG. 9B, the reference trimmer 210 of the controller 200 may compare the number of '1' included in the data DATA received from the memory device 100, which is the number of memory cells from which the stored values are read to be '1', with a preset value 'Y' (Y>0). When the number of '1' is equal to or greater than 'Y', the operation of setting the reference current and the reference resistance and the operation of reading data from the plurality of memory cells may be ceased, or otherwise the operation S440*b* may be performed after the operation S640*b*. In other words, until '1' is read from a preset number of memory cells from among the plurality of memory cells to which '1' is written, the operation of setting the reference current I_REF and the reference resistance R_REF and the operation of reading data from the plurality of memory cells may be repeated. In some embodiments, 'Y' may be equal to the number of the memory cells to which '1' is written, and in some embodiments, 'Y' may be half the number of the memory cells to which '1' is written.

In operation S440*b*, an operation of setting a decreased reference current and/or a decreased reference resistance may be performed. Accordingly, the reference voltage V_REF may also increase, and the threshold resistance $R_{TH}$ corresponding to the reference voltage V_REF may, from the parallel resistance $R_P$ distribution of FIG. 4, move to the right of the graph.

When the operations S440*b* and S600*b* are repeated, according to a reference voltage V_REF that gradually decreases, a threshold resistance $R_{TH}$ may, from the anti-parallel resistance $R_{AP}$ distribution, move to the left. Accordingly, similarly to the embodiment of FIG. 9A, as the threshold resistance $R_{TH}$ moves from the right to the left of the anti-parallel resistance $R_{AP}$ distribution, the anti-parallel resistance $R_{AP}$ distribution may be estimated.

Figure 10:
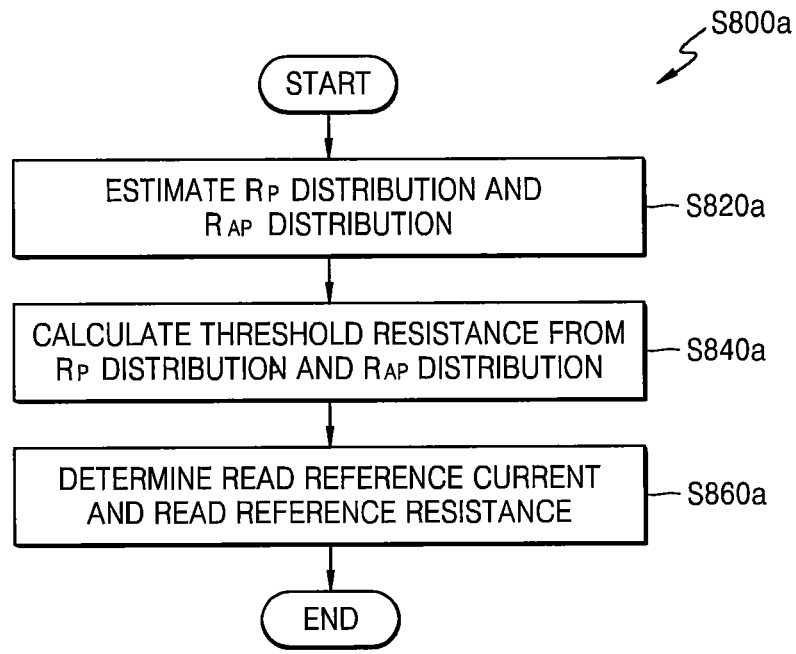
FIG. 10 is a flowchart showing an example of operation S800 shown in FIG. 8, according to example embodiments.
Figure 11:
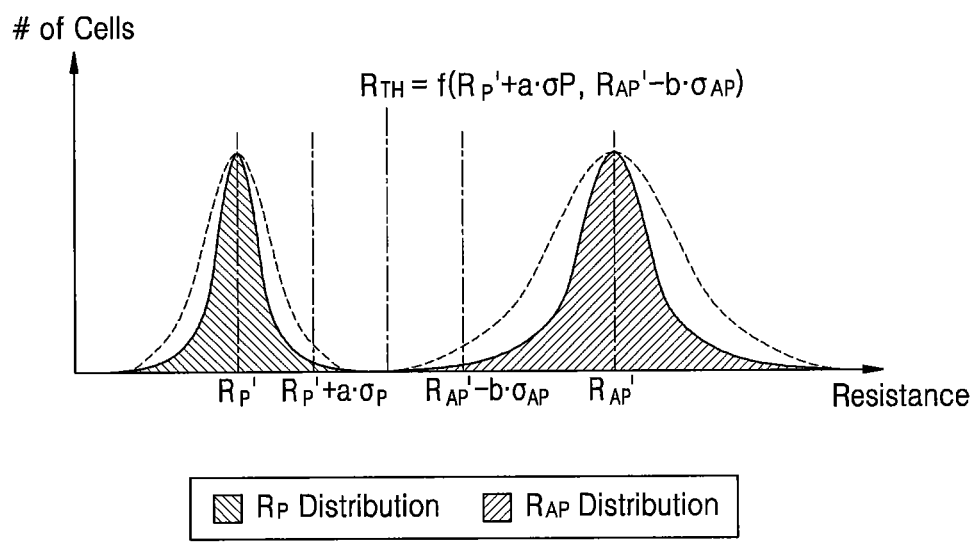
FIG. 11 is a graph showing an example of an operation of determining a threshold resistance by operation S800*a* shown in FIG. 10, according to example embodiments.

FIG. 10 is a flowchart showing an example of the operation S800 of FIG. 8, according to some example embodiments, and FIG. 11 is a graph showing an example of an operation of determining a threshold resistance by operation S800*a* of FIG. 10, according to some example embodiments. In detail, the operation S800*a* of FIG. 10 may be performed after preparing the threshold resistance $R_{TH}$ derived from the plurality of memory cells to which '0' is written, as described above with reference to FIG. 9A, and the threshold resistance $R_{TH}$ derived from the plurality of memory cells to which '1' is written, as described above with reference to FIG. 9B. As described above with reference to FIG. 8, in the operation S800*a* of FIG. 10, an operation of determining a read reference voltage, based on the results from the read operation under each of the reference voltages, may be performed.

In operation S820*a*, an operation of estimating a parallel resistance $R_P$ distribution and an anti-parallel resistance $R_{AP}$ distribution may be performed. For example, the threshold resistance $R_{TH}$ derived from the embodiment of FIG. 9A may be estimated to be a mean $R_P'$ of the parallel resistance $R_P$ distribution. In some embodiments, when the number of memory cells to which '0' is written and from which '0' is read is relatively greater, it may be identified whether '0' is read from at least half of the memory cells (that is, when 'X' in FIG. 9 is half the number of the memory cells to which '0' is written). In this case, the threshold resistance $R_{TH}$ may be estimated to be an average of the parallel resistance $R_P$ distribution. In some embodiments, when the number of memory cells to which '0' is written and from which '0' is read are relatively less, it may be identified whether '0' is read from all of the memory cells (that is, when 'X' in FIG. 9 is equal to the number of memory cells to which '0' is written). In this case, a threshold resistance $R_{TH}$ may be estimated to be a mean of a parallel resistance $R_P$ distribution. Similarly, the threshold resistance $R_{TH}$ derived from the embodiment of FIG. 9B may be estimated to be a mean $R_{AP}'$ of the anti-parallel resistance $R_{AP}$ distribution. In some embodiments, when the number of memory cells to which '1' is written and from which '1' is read is relatively greater, 'Y' in FIG. 9B may be half the number of the memory cells to which '1' is written. In some other embodiments, when the number of memory cells to which '1' is written and from which '1' is read is relatively less, 'Y' in FIG. 9B may be equal to the number of memory cells to which '1' is written. Accordingly, as shown in FIG. 11, by the operation S820*a*, locations of the parallel resistance $R_P$ distribution and the anti-parallel resistance $R_{AP}$ distribution may be estimated by the mean $R_P'$ of the parallel resistances $R_P$ and the average $R_{AP}'$ of the anti-parallel resistances $R_{AP}$. As described above, by estimating the means, the distributions of the resistances may be promptly estimated.

In operation S840*a*, an operation of calculating a threshold resistance $R_{TH}$ from the parallel resistance $R_P$ distribution and the anti-parallel resistance $R_{AP}$ distribution may be performed. In some embodiments, offsets based on standard deviations of the estimated distributions may be applied to the means, and from results of applying the offsets to the means, the threshold resistance $R_{TH}$ may be calculated. The standard deviations may be pre-derived by testing variable resistance elements (for example, MTJ of FIG. 3). As the standard deviations are applied to estimated mean values, the threshold resistance $R_{TH}$ may be more accurately determined. For example, as shown in FIG. 11, when values a and b, related to the number of cells, are greater than 0, an offset $a \cdot \sigma_P$ proportional to a standard deviation $\sigma P$ may be added to the mean $R_P'$ of the parallel resistances $R_P$. In addition, an offset $b \cdot \sigma_{AP}$ proportional to a standard deviation $\sigma_{AP}$ may be subtracted from the mean $R_{AP}'$ of the anti-parallel resistances $R_{AP}$. Accordingly, the threshold resistance $R_{TH}$ may be calculated by a function $f$ having the values $R_P'+a \cdot \sigma_P$, $R_{AP}'-b \cdot \sigma_{AP}$, which are generated by respectively applying the standard deviations $\sigma_A$, $\sigma_{AP}$ to the means $R_P'$, $R_{AP}'$, as factors. In some embodiments, the threshold resistance $R_{TH}$ for reading data from the memory cell may be calculated based on [Equation 1] written below. The read reference current may be based on a median value of a first resistance and a second resistance. The first resistance may be generated by adding a first standard resistance based on a standard deviation of the first distribution to the mean of the first distribution. The second resistance may be generated by subtracting a second standard resistance based on a standard deviation of the second distribution from the mean of the second distribution.

$$R_{TH} = \frac{(R'_P + a \cdot \sigma_P) + (R'_{AP} - b \cdot \sigma_{AP})}{2}, a > 0 \text{ and } b > 0 \quad \text{[Equation 1]}$$

In operation S860*a*, an operation of determining a read reference current and/or a read reference resistance may be performed. For example, the reference trimmer 210 may calculate a reference voltage V_REF, that is, a read reference voltage, corresponding to the threshold resistance $R_{TH}$ calculated in the operation S840a, and determine a reference current I_REF and a reference resistance R_REF corresponding to the reference voltage V_REF as the read reference current and the read reference resistance. Information or data regarding the read reference current and the read reference resistance, which are determined, may be transmitted to the control circuit 150 of the memory device 100. The control circuit 150 may store the data regarding the read reference current and the read reference resistance in the NVM 160 as data regarding the read reference voltage.

Figure 12:
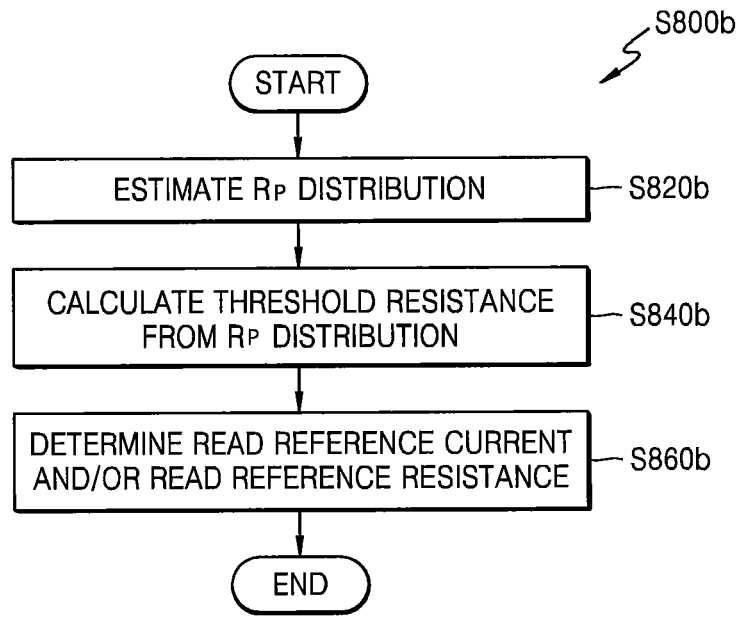
FIG. 12 is a flowchart showing an example of operation S800*b* shown in FIG. 8, according to example embodiments.
Figure 13:
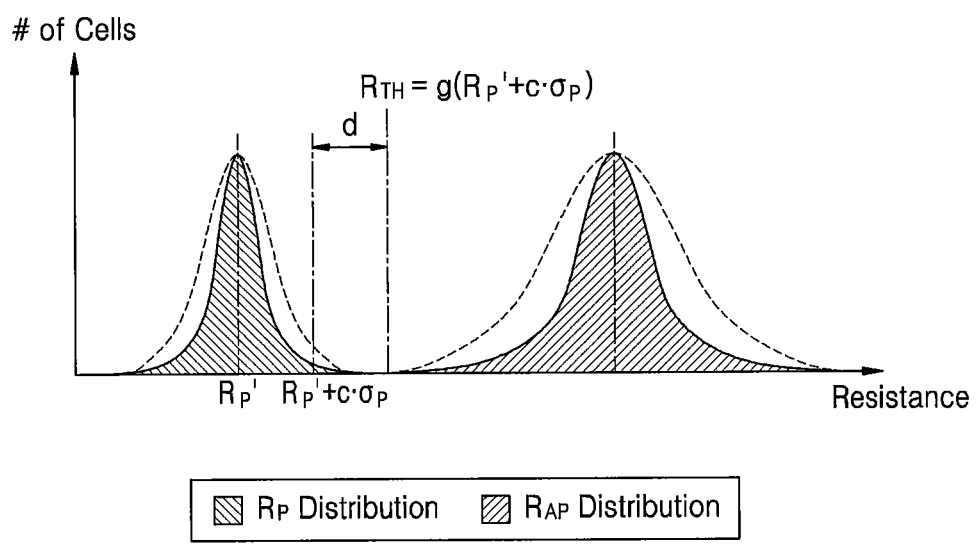
FIG. 13 is a graph showing an example of an operation of determining a threshold resistance by the operation S800*b* shown in FIG. 12, according to example embodiments.

FIG. 12 is a flowchart showing the operation S800 of FIG. 8, according to example embodiments, and FIG. 13 is a graph showing an example of an operation of determining a threshold resistance by operation S800b of FIG. 12. In detail, the operation S800b of FIG. 12, compared to the operation S800a of FIG. 10, may use the threshold resistance $R_{TH}$ determined from the plurality of memory cells to which '0' is written, as described above with reference to FIG. 9A. As described above with reference to FIG. 8, in the operation S800b of FIG. 12, an operation of determining a read reference voltage, based on results of read operations under each of the reference voltages, may be performed. Hereinafter, among descriptions of FIG. 12, descriptions overlapping with those of FIG. 10 will be omitted.

In operation S820b, an operation of estimating a parallel resistance $R_P$ distribution may be performed. Similarly to the operation S820a of FIG. 10, the threshold resistance $R_{TH}$ derived from the example of FIG. 9A may be estimated to be a mean $R_P'$ of the parallel resistance distribution $R_P$. Accordingly, as shown in FIG. 13, a location of the parallel resistance distribution $R_P$ may be estimated by the mean $R_P'$. In some embodiments, due to features of the variable resistance elements, the anti-parallel resistance $R_{AP}$ distribution may be degraded than the parallel resistance $R_P$ distribution, and thus, the parallel resistance $R_P$ distribution may be used.

In operation S840b, an operation of calculating a threshold resistance $R_{TH}$ from the parallel resistance $R_P$ distribution may be performed. In some embodiments, an offset based on a standard deviation of the estimated distribution may be applied to the mean, and from the result of applying the offset to the mean, the threshold resistance $R_{TH}$ may be calculated. For example, as shown in FIG. 13, when c is greater than 0, to the mean $R_P'$ of the parallel resistances $R_P$, an offset $c \cdot \sigma_P$ that is proportional to the standard deviation $\sigma_P$ may be added. Accordingly, the threshold resistance $R_{TH}$ may be calculated by a function g having a value of $R_P' + c \cdot \sigma_P$, which is generated by applying the standard deviation $\sigma_P$ to the mean $R_P'$, as a factor. In some embodiments, the threshold resistance $R_{TH}$ used for reading data from the memory cells may be calculated based on [Equation 2] written below.

$$R_{TH} = (R_P' + c \cdot \sigma_P) + d, \quad c > 0 \text{ and } d \geq 0 \quad \text{[Equation 2]}$$

In operation S860b, an operation of determining a read reference current and/or a read reference resistance may be performed. For example, the reference trimmer 210 may determine a reference voltage V_REF, that is, a read reference voltage, corresponding to the threshold resistance $R_{TH}$ calculated in the operation S840b, and determine a reference current I_REF and a reference resistance R_REF corresponding to the reference voltage V_REF as the read reference current and the read reference resistance. Information or data regarding the determined read reference current and the read reference resistance may be transmitted to the control circuit 150 of the memory device 100, and the control circuit 150 may store the data regarding the read reference current and the read reference resistance in the NVM 160 as data regarding the read reference voltage.

Figure 14:
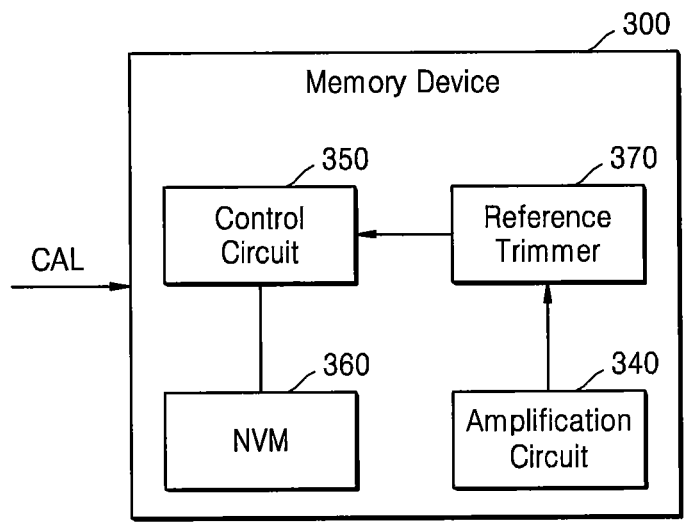
FIG. 14 is a block diagram showing a memory device according to example embodiments.

FIG. 14 is a block diagram of a memory device 300 according to an example embodiment. As illustrated in FIG. 14, the memory device 300 may include an amplification circuit 340, a control circuit 350, a non-volatile memory 360, and a reference trimmer 370. Although not illustrated in FIG. 14, the memory device 300 of FIG. 14 may, like the memory device 100 of FIG. 1, include a cell array, a current source circuit, and/or a reference resistance circuit. Hereinafter, among descriptions of FIG. 14, descriptions overlapping with those of FIG. 1 are omitted.

Compared to the memory device 100 of FIG. 1, the memory device 300 of FIG. 14 may receive a calibration signal CAL and further include the reference trimmer 370. Accordingly, the memory device 300 may, in response to the calibration signal CAL, independently derive an accurate reference voltage, and the system including the memory device 300 may, by providing the calibration signal CAL to the memory device 300, maintain operation reliability of the memory device 300.

The reference trimmer 370 may, in response to the received calibration signal CAL, write identical values to the plurality of memory cells of the cell array, and transmit signals to the control circuit 350 for generating reference voltages that monotonically increase or monotonically decrease. The reference trimmer 370 may receive a signal corresponding to values from the plurality of memory cells under each of the reference voltages from the amplification circuit 340, and may, based on results of the reading, determine a read reference voltage. The reference trimmer 370 may provide data regarding the read reference voltage to the control circuit 350, and the control circuit 350 may store data regarding the read reference voltage in the NVM 360. Afterwards, when the memory device 300 receives a read command, the control circuit 350 may control the reference current I_REF and/or the reference resistance R_REF such that the reference voltage is generated based on the data regarding the read reference voltage stored in the NVM 360.

Figure 15:
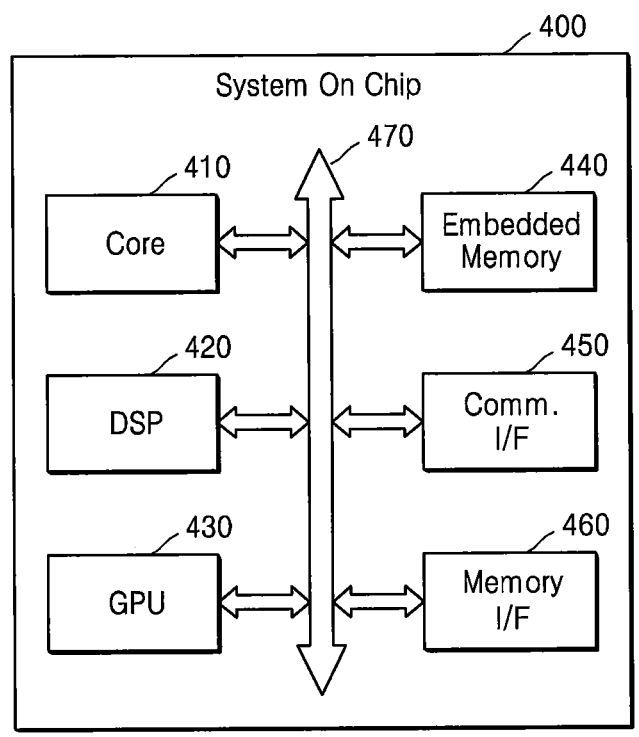
FIG. 15 is a block diagram showing a system-on-chip including the memory device according to example embodiments.

FIG. 15 is a block diagram illustrating a system on chip (SOC) 400 including the memory device, according to an example embodiment. The SOC 400 may refer to an integrated circuit in which components of a computing system or other electronic systems are integrated. For example, as the SOC 400, an application processor (AP) may include components for a processor and other functions. As illustrated in FIG. 15, the system-on-chip 400 may include a core 410, a digital signal processor (DSP) 420, a graphic processing unit (GPU) 430, an embedded memory 440, a communication interface 450, and a memory interface 460. Components of the system-on-chip 400 may communicate with each other via a bus 470.

The core 410 may process commands and control operations of the components included in the system-on-chip 400. For example, the core 410 may, by processing a series of commands, drive an operation system and execute applications in the operation system. The DSP 420 may process digital signals, for example, digital signals provided from the communication interface 450, to generate useful data. The GPU 430 may generate data for images output through a display device by using image data provided by the embedded memory 440 or the memory interface 460, and may also encode the image data.

The embedded memory 440 may store data required for operations of the core 410, the DSP 420, and the GPU 430.

The embedded memory 440 may include the resistive memory according to an example embodiment, and accordingly, the embedded memory 440 may provide high reliability resulting from accurate reference voltages.

The communication interface 450 may provide interfaces for communication networks or one to one communications. The memory interface 460 may provide interfaces for external memories of the SOC 400, for example, dynamic random access memory (DRAM), a flash memory, and the like.

While the inventive concept has been particularly shown and described with reference to embodiments thereof, it will be understood that various changes in form and details may be made therein without departing from the spirit and scope of the following claims.

What is claimed is:

1. A method of controlling a reference cell in a resistive memory to identify values stored in a plurality of memory cells, the method comprising:
   writing a first value to the plurality of memory cells;
   providing, to the reference cell, reference currents that either only monotonically increase or only monotonically decrease, wherein the reference cell is a shorted cell;
   reading repeatedly the plurality of memory cells written as the first value while the reference currents monotonically increase or decrease; and
   determining a read reference current based on results of the repeated reading.

2. The method of claim 1, further comprising:
   setting reference resistances of a reference resistor associated with the reference cell, wherein ones of the reference resistances correspond to ones of the reference currents that pass through the reference resistor, and wherein the reference resistances monotonically increase or monotonically decrease; and
   determining a read reference resistance based on an aggregation of results of reading data from the plurality of memory cells for each of the reference currents and corresponding ones of the reference resistances of the reference resistor.

3. The method of claim 1, wherein the determining the read reference current comprises:
   estimating a first distribution of resistances corresponding to the first value written to the plurality of the memory cells based on a number of times that the first value is read out of the results of the reading.

4. The method of claim 3,
   wherein the first value and a second value, different from the first value, respectively correspond to a low resistance and a high resistance of the plurality of memory cells,
   wherein the providing the reference currents comprises providing monotonically increasing reference currents, and
   wherein the estimating the first distribution comprises estimating a threshold resistance as a mean of the first distribution based on the threshold resistance corresponding to a reference current when the number of times that the first value is read is equal to or greater than a first threshold number of successful read operations of the first value.

5. The method of claim 4, further comprising:
   writing the second value to the plurality of memory cells, wherein the providing the reference currents further comprises providing monotonically decreasing reference currents,
   wherein the determining the read reference current further comprises estimating a second distribution of resistances corresponding to the second value written to the plurality of the memory cells, based on a number of times that the second value is read out of the results of the reading, and
   wherein the estimating the second distribution comprises estimating the threshold resistance as a mean of the second distribution based on the threshold resistance corresponding to a reference current, when the number of times that the second value is read is equal to or greater than a second threshold number of successful read operations of the second value.

6. The method of claim 5, wherein the determining the read reference current comprises:
   determining the read reference current based on a median value of a first resistance and a second resistance,
   wherein the first resistance is generated by adding a first standard resistance based on a standard deviation of the first distribution to the mean of the first distribution, and
   wherein the second resistance is generated by subtracting a second standard resistance based on a standard deviation of the second distribution from the mean of the second distribution.

7. The method of claim 4, wherein the determining the read reference current further comprises:
   calculating the read reference current based on a predefined function having a mean of the first distribution as a factor.

8. The method of claim 1, further comprising:
   writing control data, corresponding to the read reference current, to the resistive memory.

9. A method of controlling a reference cell in a resistive memory to identify values stored in a plurality of memory cells, the method comprising:
   writing a first value to the plurality of memory cells;
   setting monotonically increasing or monotonically decreasing resistances of a reference resistor through which a reference current passes, wherein the reference current also passes through the reference cell, and wherein the reference cell is a shorted cell;
   reading repeatedly the plurality of memory cells written as the first value, while the resistances of the reference resistor monotonically increase or decrease; and
   determining a read reference resistance, based on an aggregation of results of the repeated reading by estimating a first distribution of resistances corresponding to the first value stored in the memory cells based on the results of the repeated reading.

10. The method of claim 9,
    wherein the first value and a second value, different from the first value, respectively correspond to a low resistance and a high resistance of the plurality of memory cells,
    wherein the setting monotonically increasing or monotonically decreasing resistances comprises setting monotonically increasing resistances of the reference resistor, and
    wherein the estimating the first distribution comprises estimating a threshold resistance as a mean of the first distribution based on the threshold resistance corresponding to a reference resistance of the reference resistor when a number of times that the first value is read is equal to or greater than a first threshold number of successful read operations of the first value.

11. The method of claim 10, further comprising:
writing the second value to the plurality of memory cells;
wherein the setting the monotonically increasing or monotonically decreasing resistances further comprises setting monotonically decreasing resistances of the reference resistor,
wherein the determining of the read reference resistance further comprises estimating a second distribution of resistances corresponding to the second value written to the plurality of the memory cells based on a number of the second value that the second value is read from among the results of the reading, and
wherein the estimating the second distribution comprises estimating a threshold resistance as a mean of the second distribution based on the threshold resistance corresponding to the reference resistance of the reference resistor when the number of times that the second value is read is equal to or greater than a second threshold number of successful read operations of the second value.

12. The method of claim 11, wherein the determining of the read reference resistance comprises:
determining a read reference resistance of the reference resistor based on a median value of a first resistance and a second resistance,
wherein the first resistance is generated by adding a first standard resistance based on a standard deviation of the first distribution to the mean of the first distribution, and
wherein the second resistance is generated by subtracting a second standard resistance based on a standard deviation of the second distribution from the mean of the second distribution.

13. The method of claim 10, wherein the determining of the read reference resistance further comprises:
calculating the read reference resistance based on a predefined function having the mean of the first distribution as a factor.

14. The method of claim 9, further comprising:
writing control data, corresponding to the read reference resistance, to the resistive memory.

15. A resistive memory device configured to receive a reference adjustment signal, the resistive memory device comprising:
a cell array comprising memory cells and a reference cell, wherein the memory cells are connected to respective first source lines and respective first bit lines, and wherein the reference cell is connected to a second source line and a second bit line;
a current source circuit configured to provide, in response to a read command, a read current and a variable reference current respectively to the memory cells and the reference cell via the first source lines or the second source line;
an amplification circuit configured to detect voltages between the first source lines connected to the memory cells and the second source line connected to the reference cell; and
a control circuit configured to control the current source circuit such that the reference current is adjusted regardless of the read current, in response to the reference adjustment signal,
wherein the reference cell comprises:
a transistor connected to the second source line and the second bit line and having a gate connected to a word line that is connected to at least one of the memory cells,
wherein the transistor is configured to electrically connect the second source line and the second bit line in response to the word line being activated, and
wherein a memory cell of the memory cells comprises a magnetic tunnel junction (MTJ) element and a transistor serially connected between a corresponding third source line of the first source lines and a corresponding third bit line of the first bit lines connected to the memory cell, and
wherein the transistor comprises a gate connected to a same word line as the reference cell.

16. The resistive memory device of claim 15, further comprising:
a reference resistor circuit connected to the reference cell through the second bit line and configured to, in response to the read command, provide a variable reference resistance between the second bit line and a negative supply voltage,
wherein the control circuit is further configured to control the reference resistor circuit such that the variable reference resistance of the reference resistor is adjusted in response to the reference adjustment signal.

17. The resistive memory device of claim 15, further comprising:
a non-volatile memory,
wherein the control circuit is configured to, in response to a setting command, write a value according to the reference adjustment signal to the non-volatile memory, and in response to a read command, control the current source circuit based on the value stored in the non-volatile memory.

* * * * *